United States Patent [19]

Nakano et al.

[11] Patent Number: 4,807,192
[45] Date of Patent: Feb. 21, 1989

[54] MEMORY DEVICE EMPLOYING ADDRESS MULTIPLEXING

[75] Inventors: Masao Nakano, Kasugai; Hirohiko Mochizuki; Tsuyoshi Ohira, both of Kawasaki; Yukinori Kodama; Hidenori Nomura, both of Yokohama, all of Japan

[73] Assignees: Fujitsu Limited, Kanagawa; Fujitsu Vlsi Limited, Aichi, both of Japan

[21] Appl. No.: 90,988

[22] Filed: Aug. 31, 1987

[30] Foreign Application Priority Data

Sep. 4, 1986 [JP] Japan .................................. 61-208527
Sep. 4, 1986 [JP] Japan .................................. 61-208526

[51] Int. Cl.⁴ ........................ G11C 11/40; G11C 13/00
[52] U.S. Cl. ........................................ 365/193; 365/189
[58] Field of Search ............... 365/189, 230, 193, 194, 365/195

Primary Examiner—Terrell W. Fears
Attorney, Agent, or Firm—Armstrong, Nikaido, Marmelstein & Kubovcik

[57] ABSTRACT

A memory device employing address multiplexing comprises a counter. An external address is initially set in the counter and a counter address value is incremented responsive to toggle of a column address strobe. The counted address value in the counter is supplied as an address signal directly to a column decoder or indirectly to the column decoder through an address buffer. The memory device may be provided with a switching logic circuit which switches the address bits in the counter depending on switching information so that it is possible to arbitrarily determine which address bits in the counter are to determine a nibble address.

17 Claims, 10 Drawing Sheets

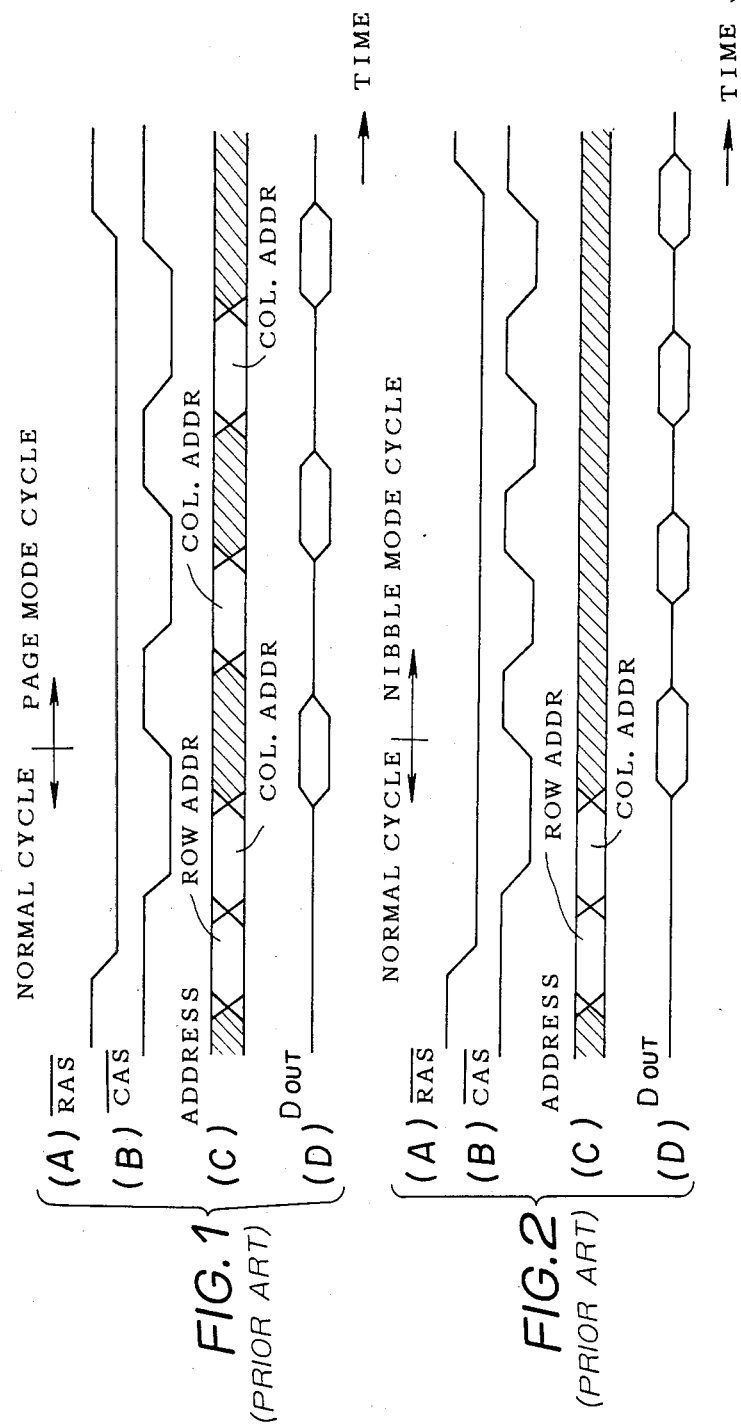

MEMORY DEVICE EMPLOYING ADDRESS MULTIPLEXING

BACKGROUND OF THE INVENTION

The present invention generally relates to memory devices employing address multiplexing, and more particularly to a memory device employing address multiplexing and comprising a counter which generates an address of a column decoder responsive to toggle of a column address strobe (CAS).

As modes of writing and reading data from a memory device at a high speed, there are the page mode and the nibble mode. In a memory device employing the address multiplexing, column and row addresses are received from an exterior responsive to a row address strobe (RAS) and a column address strobe (CAS), respectively. The timings of the RAS and the CAS are used effectively in the page and nibble modes to realize the high-speed operation.

In the page mode, a plurality of inverted column address strobes (hereinafter simply referred to as $\overline{CAS}$) are entered for one active time period of an inverted row address strobe (hereinafter simply referred to as a $\overline{RAS}$), so that the writing and reading of data to memory cells can be carried out at a high speed. In other words, access is made to the memory cells designated by a row address which is set when the $\overline{RAS}$ is made active, by successively entering a column address and the $\overline{CAS}$ in a state where the $\overline{RAS}$ is maintained active. Since the access is made to the memory cells without changing the row address, there is no address selection time nor resetting time for the row selection, and it is thus possible to obtain a quick access time and a short cycle time. In addition, in the case of a 64 K memory device, for example, it is possible to make access to the memory cells corresponding to 256 bits during one active time period of the $\overline{RAS}$, and it is possible to carry out the writing and reading of data to and from these memory cells at random.

On the other hand, in the nibble mode, it is only possible to make access to the memory cells corresponding to 4 bits during one active time period of the $\overline{RAS}$. However, when making access to the 4 bits, it is only necessary to initially determine the first bit by an external address, and the access to the remaining bits can be made serially and cyclicly thereafter by merely entering the $\overline{CAS}$. Accordingly, unlike in the page mode, there is no need to enter the column address in correspondence with each $\overline{CAS}$, and it is hence possible to carry out the writing and reading of the data at an even higher speed compared to the page mode.

But as will be described later on in conjunction with drawings, there are problems in that the numbers of data bus pairs, sense and latch circuits, and write-in buffers become extremely large for a large number of parallel input and output bits, and these data buses and circuit parts occupy a large area of the memory device. In addition, there is a problem in that the power consumption becomes large due to the large number of circuit parts. On the other hand, similar problems occur when the number of serial bits to be outputted in the nibble mode becomes large.

SUMMARY OF THE INVENTION

Accordingly, it is a general object of the present invention to provide a novel and useful memory device employing address multiplexing, in which the problems described heretofore are eliminated.

Another and more specific object of the present invention is to provide a memory device employing address multiplexing and comprising a counter. An external address is initially set in the counter and a counted address value is incremented responsive to toggle of a column address strobe. The counted address value in the counter is supplied as an address signal directly to a column decoder or indirectly to the column decoder through an address buffer. According to the memory device of the present invention, it is possible to carry out the writing and reading operation at a high speed as in the case of a nibble mode. In addition, even when the number of parallel input and output bits is large, the circuit construction is simple and an area occupied by circuit parts constituting the memory device is small compared to that of the conventional memory device. Furthermore, it is possible to increase the number of serial bits which are output by simply increasing the number of bits of the counter.

Still another object of the present invention is to provide a memory device employing the address multiplexing and comprising a counter and a switching logic circuit. An external address is initially set in the counter and a counted address value is incremented responsive to toggle of a column address strobe. The counted address value in the counter is supplied as an address signal directly to a column decoder or indirectly to the column decoder through an address buffer. The switching logic circuit switches the address bits in the counter depending on information such as bonding information, information concerning the melting of a fuse and information related to aluminum wiring. According to the memory device of the present invention, it is possible to arbitrarily determine which address bits in the counter are to determine a nibble address. Hence, it is possible to use the same counter to generate the nibble address for memory device having different memory structures.

Other objects and further features of the present invention will be apparent from the following detailed description when read in conjunction with the accompanying drawings.

BRIEF DESCRIPTION OF THE DRAWINGS

FIGS. 1(A) through 1(D) are timing charts for explaining the operation of the conventional memory device in a page mode;

FIGS. 2(A) through 2(D) are timing charts for explaining the operation of the conventional memory device in a nibble mode;

FIG. 6 is a system block diagram showing a more detailed construction of the first embodiment;

DETAILED DESCRIPTION

FIGS. 1(A) through 1(D) are timing charts for explaining the operation of the conventional memory device described before in the page mode, where "Col. Addr" denotes the column address, "Row Addr" denotes the row address, and $D_{OUT}$ denotes the output. Similarly, FIGS. 2(A) through 2(D) are timing charts for explaining the operation of the conventional memory device described before in the nibble mode, where the same designations are used as in FIGS. 1(A) through 1(D).

In the page mode, a plurality of the $\overline{CAS}$ are entered for one active time period of the $\overline{RAS}$, so that the writing and reading of data to memory cells can be carried out at a high speed. In other words, access is made to the memory cells designated by a row address which is set when the $\overline{RAS}$ is made active, by successively entering a column address and the $\overline{CAS}$ in a state where the $\overline{RAS}$ is maintained active.

On the other hand, in the nibble mode, it is only possible to make access to the memory cells corresponding to 4 bits during one active time period of the $\overline{RAS}$. However, when making access to the 4 bits, it is only necessary to initially determine the first bit by an external address, and the access to the remaining bits can be made serially and cyclicly thereafter by merely entering the $\overline{CAS}$. Accordingly, unlike in the page mode, there is no need to enter the column address in correspondence with each $\overline{CAS}$, and it is hence possible to carry out the writing and reading of the data at an even higher speed compared to the page mode.

Figure 3:
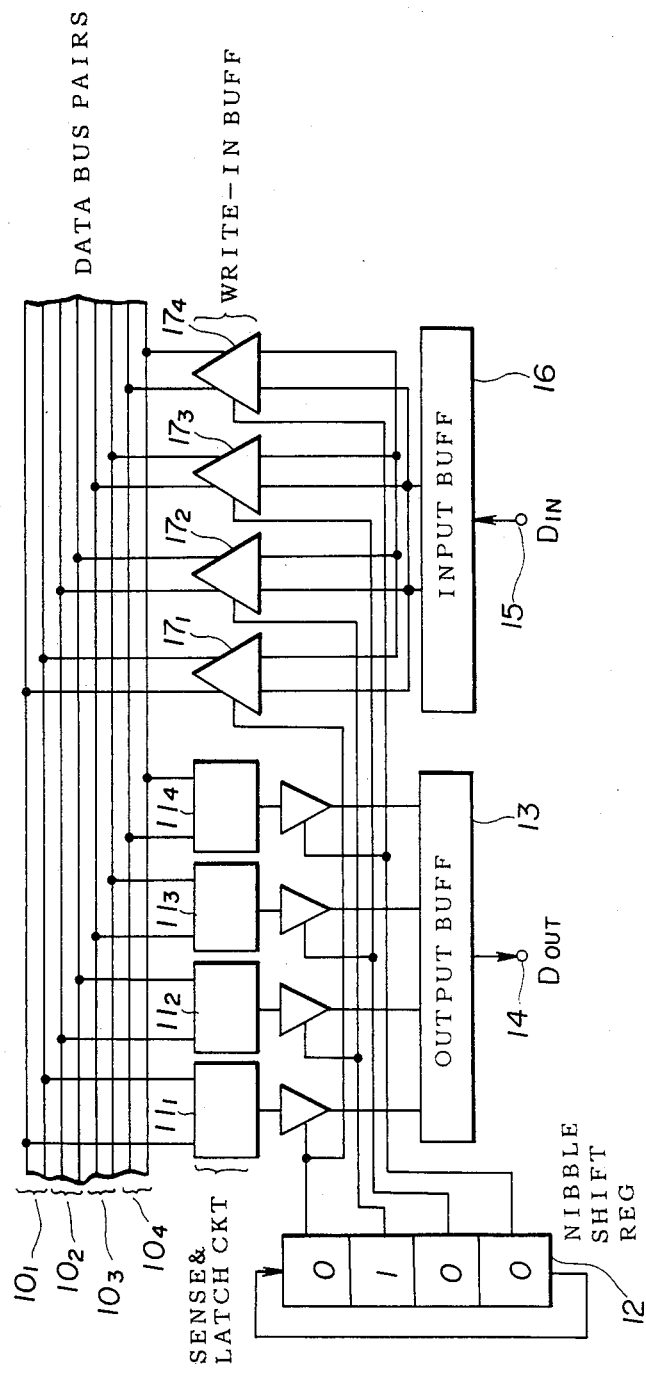
FIG. 3 is a system circuit diagram showing an essential part of the conventional memory device for explaining the nibble mode.

FIG. 3 shows an essential part of the conventional 64 K dynamic random access memory (DRAM) having the nibble mode. There are four data bus pairs $10_1$ through $10_4$ for the nibble, that is, 4 bits. During the read operation, the 4 bits of stored data from the memory cells (not shown) are supplied to sense and latch circuits $11_1$ through $11_4$ in parallel through the respective data bus pairs $10_1$ through $10_4$. An initial content is set in a nibble shift register 12, and the content of the nibble shift register 12 is successively shifted responsive to the toggle of the $\overline{CAS}$. The 4 bits of data are successively latched in the sense and latch circuits $11_1$ through $11_4$ and are sequentially outputted as the output $D_{OUT}$ from an output buffer 13 responsive to an output of the nibble shift register 12. The serial output $D_{OUT}$ is obtained through a terminal 14.

During the write operation, a serial input $D_{IN}$ is applied to a terminal 15 and is supplied to an input buffer 16. The input buffer 16 supplies the serial input $D_{IN}$ as parallel 4 bit data to write-in buffers $17_1$ through $17_4$, and the write-in buffers $17_1$ through $17_4$ successively supply the 4 bit parallel data to the memory cells through the respective data bus pairs $10_1$ through $10_4$ responsive to the output of the nibble shift register 12. At the same time, the 4 bit data on the data bus pairs $10_1$ through $10_4$ are latched by the sense and latch circuits $11_1$ through $11_4$. Accordingly, during one active time period of the $\overline{RAS}$ in the nibble mode, the stored data may be rewritten or the write-in data which is written may be read out.

However, according to the conventional memory device, there are problems in that the numbers of data bus pairs, sense and latch circuits, and write-in buffers become extremely large for a large number of parallel input and output bits, and these data buses and circuit parts occupy a large area of the memory device. For example, in the case where there are 4 parallel input and output bits, it is necessary to provide 16 data bus pairs, 16 sense and latch circuits, and 16 write-in buffers. In addition, there is a problem in that the power consumption becomes large due to the large number of circuit parts. On the other hand, similar problems occur when the number of serial bits to be outputted in the nibble mode becomes large.

Accordingly, the present invention eliminates these problems of the conventional memory device by providing a counter which generates an address of a column decoder responsive to toggle of the $\overline{CAS}$ in the nibble mode.

Generally, the term "nibble" is used to indicate half byte or 4 bits. However, the scope of the present invention is not limited to the conventional nibble mode, and for this reason, the term "nibble" is used in a more broader sense in the present specification and is not limited to 4 bits as will be described later on in the present specification.

Figure 4:
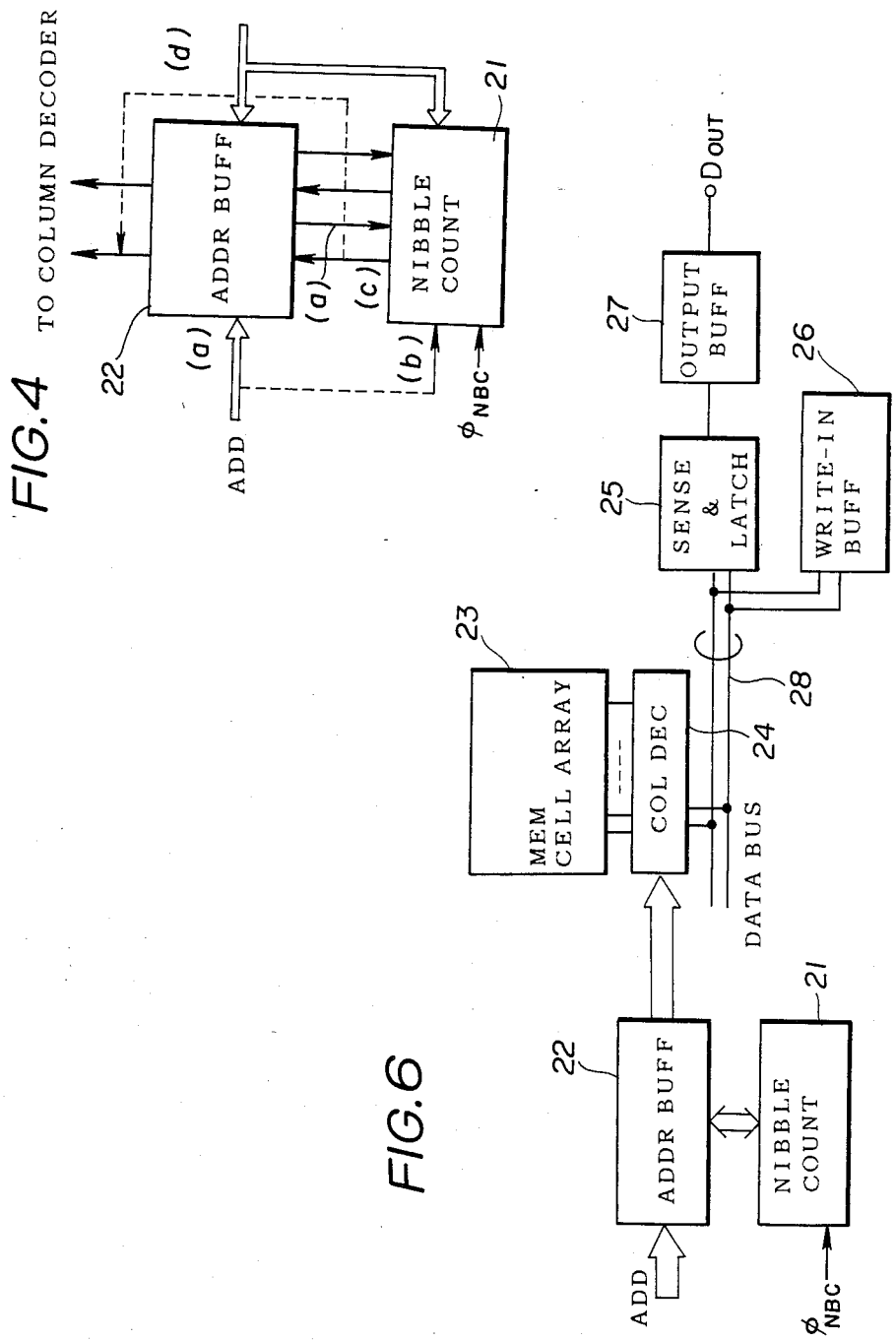
FIG. 4 is a system block diagram showing an essential part of a first embodiment of the memory device according to the present invention for explaining the operating principle thereof.
Figure 5:
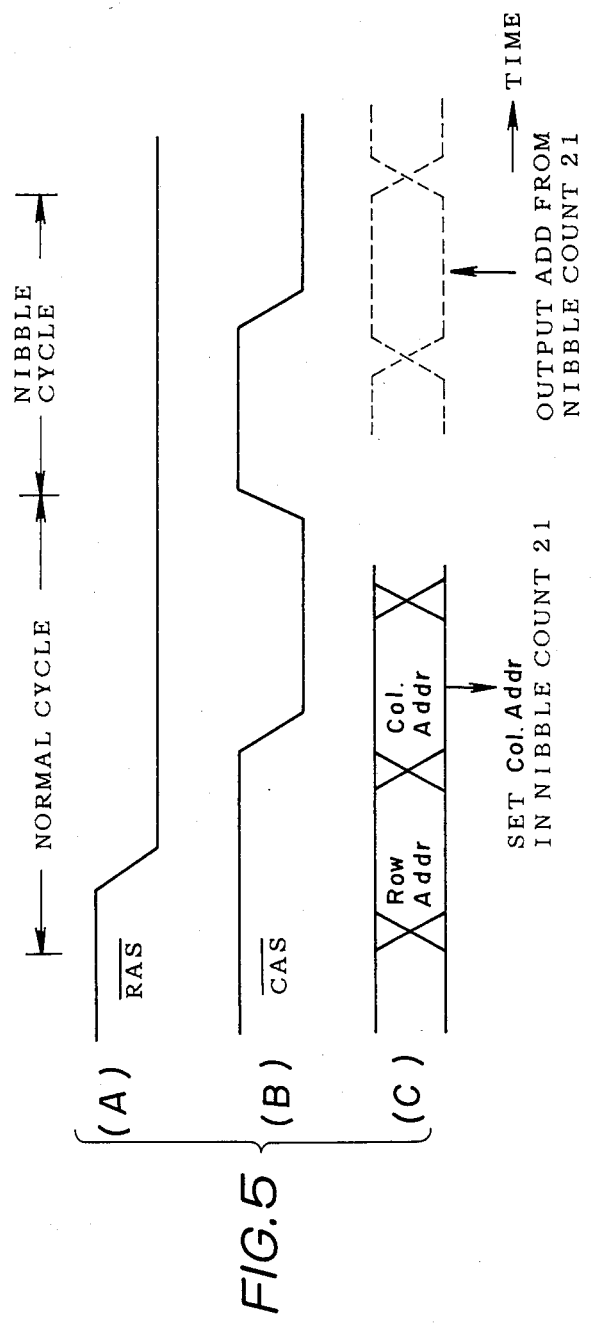
FIGS. 5(A) through 5(C) are timing charts for explaining the operation of the block system shown in FIG. 4.

FIG. 4 shows an essential part of a first embodiment of the memory device according to the present invention for explaining the operating principle thereof. In FIG. 4, ADD denotes an external address, and $\phi$ denotes a clock signal for setting the column address of the external address ADD in an address buffer 22. This clock signal $\phi$ is generated responsive to a falling edge of the $\overline{CAS}$. FIGS. 5(A) through 5(C) are timing charts for explaining the operation of the block system shown in FIG. 4.

In the normal cycle, the column address of the external address ADD is set in a nibble counter 21 as shown in FIG. 5(C). The operation of setting this column address is carried out responsive to the clock signal $\phi$. The external address ADD may be set in the nibble counter 21 through the address buffer 22 as indicated by solid line (a), or the column address may be set directly in the nibble counter 21 as indicated by phantom line (b).

After the external address ADD is set, the nibble counter 21 counts up responsive to a nibble clock signal $\phi_{NBC}$. The address in the nibble counter 21 is obtained in the next nibble cycle, and a column decoder (not shown) is operated. The address from the nibble counter 21 may be supplied to the column decoder after being amplified in the address buffer 22 as indicated by solid line (c), or the address from the nibble counter 21 may be supplied directly to the column decoder as indicated by phantom line (d). After the address is output from the nibble counter 21, the counted address value in the nibble counter 21 is incremented responsive to the nibble clock signal $\phi_{NBC}$.

Accordingly, there are the following advantages although the data read-out speed is slowed down by an amount corresponding to the time it takes to initially set the external address ADD. Firstly, it is possible to reduce the number of data bus pairs, the sense and latch circuits, and the write-in buffers compared to the conventional memory device. As a result, the area occupied by the data bus pairs and the circuit parts is reduced compared to that of the conventional memory device. These advantages become particularly notable as the number of parallel input and output bits becomes large. Secondly, 4 bits are output by the toggle of the $\overline{CAS}$ in the nibble mode of the conventional memory device, but according to the present embodiment, it is possible to output a larger number of bits by increasing the number of bits of the nibble counter 21.

Figure 7:
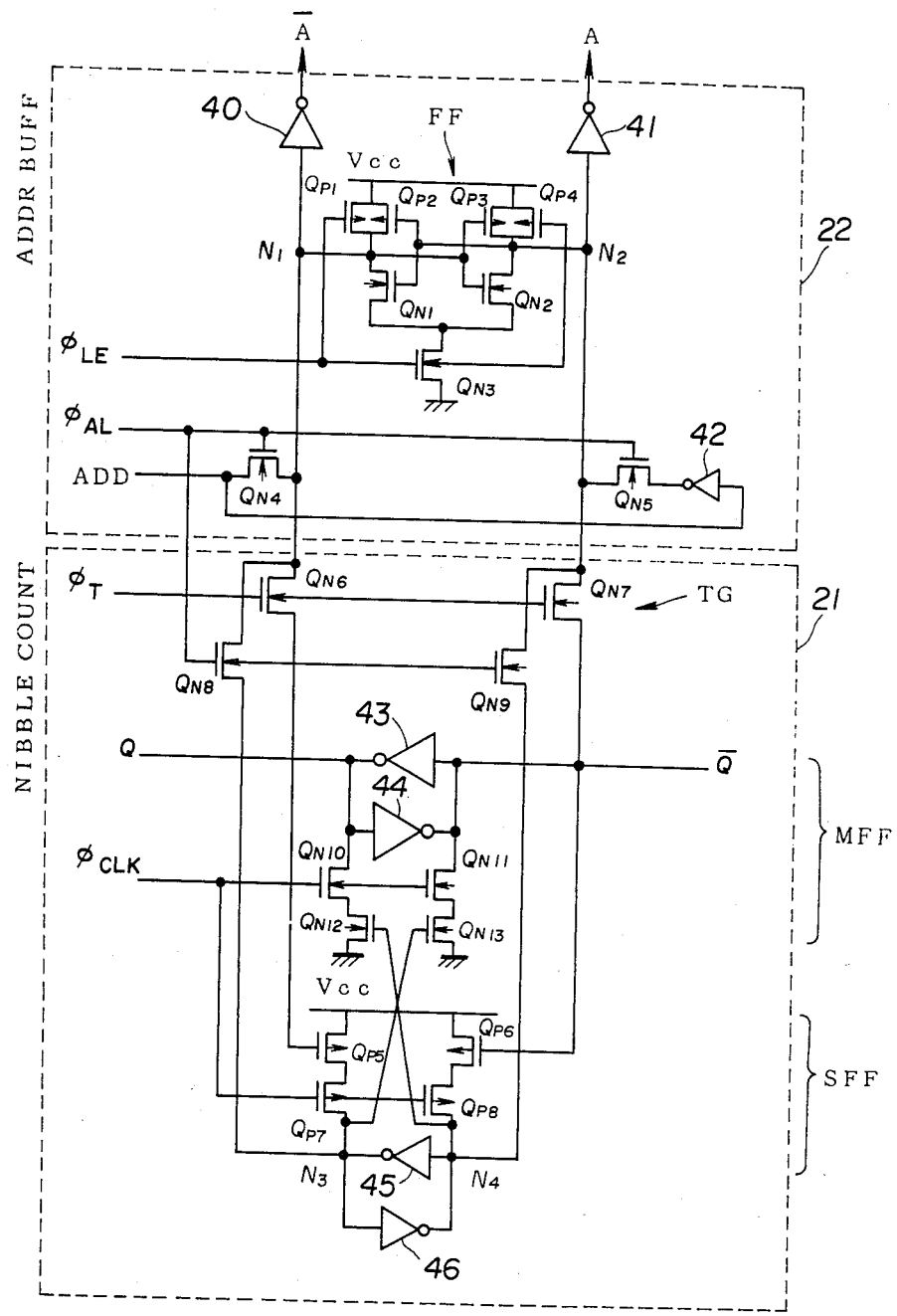
FIG. 7 is a circuit diagram showing an embodiment of the circuit construction of a nibble counter and an address buffer shown in FIG. 6 for one address bit.

FIG. 6 shows a more detailed construction of the first embodiment, and FIG. 7 shows an embodiment of the circuit construction of the nibble counter 21 and the address buffer 22 for one address bit. In FIGS. 6 and 7, those parts which are the same as those corresponding parts in FIG. 4 are designated by the same reference numerals, and a description thereof will be omitted. In FIG. 6, the memory device generally comprises the nibble counter 21, the address buffer 22, a memory cell array 23 having a matrix arrangement of memory cells (not shown) each designated by a row address and a column address, a column decoder 24, a sense and latch circuit 25 for 4 bits, a write-in buffer 26 for 4 bits, an output buffer 27, and a data bus 28.

In FIG. 7, the address buffer 22 comprises a flip-flop FF, inverters 40 through 42, and N-channel transistors $Q_{N4}$ and $Q_{N5}$. The flip-flop FF comprises P-channel transistors $Q_{P1}$ through $Q_{P4}$ and N-channel transistors $Q_{N1}$ through $Q_{N3}$. On the other hand, the nibble counter 21 comprises a transfer gate TG constituted by N-channel transistors $Q_{N6}$ and $Q_{N7}$, N-channel transistors $Q_{N8}$ and $Q_{N9}$, a master flip-flop MFF and a slave flip-flop SFF. The master flip-flop MFF comprises inverters 43 and 44, and N-channel transistors $Q_{N10}$ through $Q_{N13}$. The slave flip-flop SFF comprises inverters 45 and 46, and P-channel transistors $Q_{P5}$ through $Q_{P8}$. In FIG. 7, Vcc denotes a power source voltage.

In the nibble mode, the first bit must initially be determined by the external address ADD. Hence, the nibble counter 21 has the function of initially entering the first bit from the external address ADD. As shown in FIG. 7, the address buffer 22 is provided with the flip-flop FF and stores the first address bit responsive to a latch enable clock signal $\phi_{LE}$. On the other hand, the nibble counter 21 is provided with the master flip-flop MFF and the slave flip-flop SFF which operate alternately. Out of the external address ADD, the data at nodes $N_1$ and $N_2$ in the address buffer 22 is set to nodes $N_3$ and $N_4$ in the slave flip-flop SFF by the operation of transistors $Q_{N8}$ and $Q_{N9}$. A signal $\phi_{AL}$ is controlled so that the data is only set the first time. Thereafter, the level of a control clock signal $\phi_T$ for the transfer gate TG in the nibble counter 21 is raised so as to output counter information Q and $\overline{Q}$ from the nibble counter 21 to the nodes $N_1$ and $N_2$ in the address buffer 22. In this manner, after the address is outputted, the counted address value of the nibble counter 21 is incremented responsive to a clock signal $\phi_{CLK}$, and the counter information Q and $\overline{Q}$ are successively outputted.

In FIG. 7, the circuit parts shown correspond only to one bit of the nibble counter 21 and the address buffer 22. However, the nibble counter 21 and the address buffer 22 actually comprise circuit parts corresponding to a predetermined number of bits required to set the external address ADD. For example, the circuit parts actually provided correspond to 2 bits of the address which is varied. It is possible to provide circuit parts corresponding to more than 2 bits, but the address portion of the bits provided in addition to the 2 bits is not varied.

Figure 8:
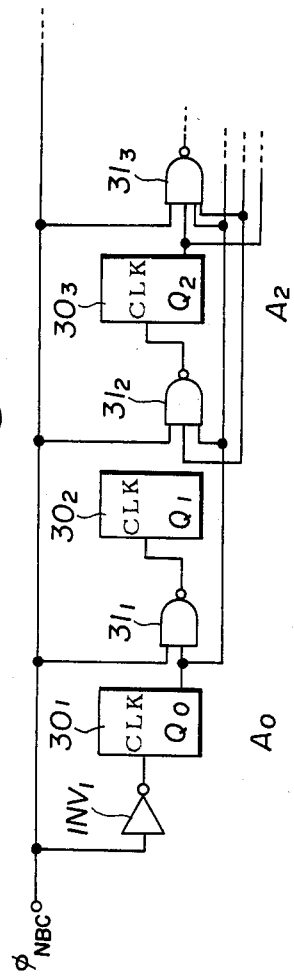
FIG. 8 is a system circuit diagram showing an embodiment of the connection of counters constituting the nibble counter.

FIG. 8 shows an embodiment of the connection of counters constituting the nibble counter 21. The nibble counter 21 comprises a plurality of counter elements $30_1$, $30_2$, $30_3$, ... (only three shown) in correspondence with each bit of the nibble counter 21, an inverter $INV_1$ and a plurality of NAND circuits $31_1$, $31_2$, $31_3$, ... (only three shown). Each NAND circuit determines whether or not to take a figure up one place based on the information from the counter in the previous stage.

Figure 9:
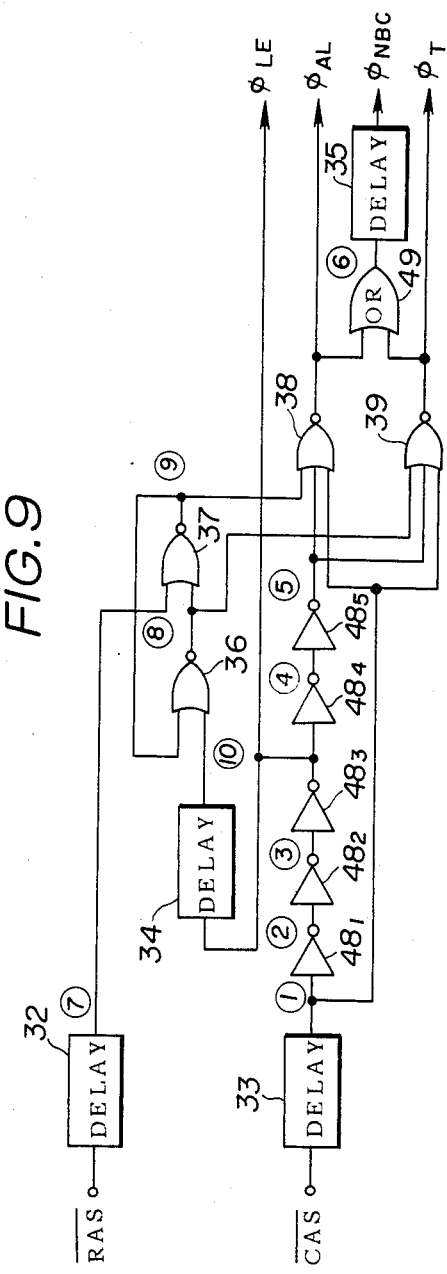
FIG. 9 is a system circuit diagram showing an embodiment of a clock generating circuit for generating signals which control the block system shown in FIG. 7.

FIG. 9 shows an embodiment of a clock generating circuit for generating signals which control the block system shown in FIG. 6. The clock generating circuit comprises delay circuits 32 through 35, NOR circuits 36 through 39, inverters $48_1$ through $48_5$, and an OR circuit 49.

Figure 10:
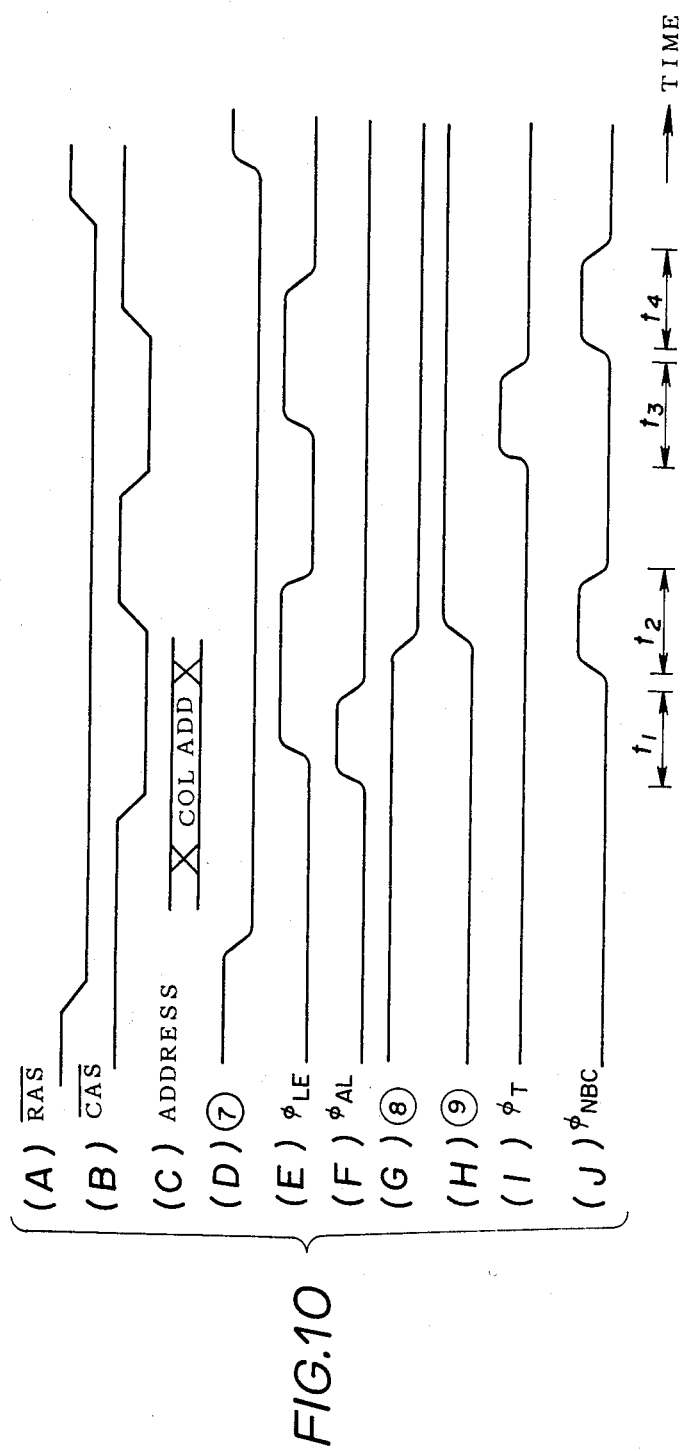
FIGS. 10(A) through 10(J) are timing charts for explaining the operation of the clock generating circuit shown in FIG. 9.

FIGS. 10(A) through 10(J) are timing charts for explaining the operation of the clock generating circuit shown in FIG. 9. FIGS. 10(A) and 10(B) respectively show the $\overline{RAS}$ and $\overline{CAS}$, and FIG. 10(C) shows the address. Out of signal waveforms obtained at nodes ① through ⑩ in FIG. 9, FIGS. 10(D), 10(G) and 10(H) respectively show the signal waveforms obtained the nodes ⑦, ⑧ and ⑨. FIGS. 10(E), 10(F), 10(I) and 10(J) respectively show signals $\phi_{LE}$, $\phi_{AL}$, $\phi_T$ and $\phi_{NBC}$. In FIGS. 10(A) through 10(J), the first external address ADD is entered into the nibble counter 21 responsive to the signal $\phi_{A1}$ during a time $t_1$, the counted address value is incremented responsive to the nibble clock signal $\phi_{NBC}$ during a time $t_2$, the address is outputted from the nibble counter 21 during a time $t_3$, and the counted address value is incremented responsive to the nibble clock signal $\phi_{NBC}$ during a time $t_4$.

Next, a more detailed description will be given on the operation of the circuit systems shown in FIGS. 7 through 9 by referring to the timing charts shown in FIGS. 10(A) through 10(J).

When the $\overline{CAS}$ falls as shown in FIG. 10(A), the clock generating circuit produces the signal $\phi_{A1}$ by using a time interval between a falling edge of the signal at the node ① and a falling edge of the signal at the node ⑤. In FIG. 7, the external address ADD is entered in address buffer 22 responsive to the signal $\phi_{AL}$ shown in FIG. 10(F) and is latched responsive to the latch enable clock signal $\phi_{LE}$ shown in FIG. 10(E). The latched address is outputted as addresses A and $\overline{A}$ to determine the first bit of the column address.

When the latch enable clock signal $\phi_{LE}$ is received for the second time, the signal level at the node ⑧ falls as shown in FIG. 10(G), the signal level at the node ⑨ rises as shown in FIG. 10(H), and the signal $\phi_{AL}$ is produced only once as shown in FIG. 10(F) and is not produced unless reset by the delayed $\overline{RAS}$ at the node ⑦ shown in FIG. 10(D). The data is set in the slave flip-flop SFF of the nibble counter 21 responsive to the signal $\phi_{AL}$.

On the other hand, the control clock signal $\phi_T$ shown in FIG. 10(I) is produced responsive to the fall in the signal at the node ⑧ shown in FIG. 10(G) and the second and subsequent of the $\overline{CAS}$ shown in FIG. 10(B). The nibble clock signal $\phi_{NBC}$ is produced by delaying a logical sum of the signals $\phi_{AL}$ and $\phi_T$. The data in the slave flip-flop SFF is transferred to the master flip-flop MFF during the high-level period of the control clock signal $\phi_T$, and the data in the master flip-flop MFF is transferred to the slave flip-flop SFF during the low-level period of the control clock signal $\phi_T$.

The clock signal $\phi_{CLK}$ described before is produced by carrying out a NAND operation between the nibble clock signal $\phi_{NBC}$ and an output of the counter in the previous stage in FIG. 8. Hence, the nibble counter 21 increments the count responsive to the clock signal $\phi_{CLK}$ in FIG. 7.

Figure 11:
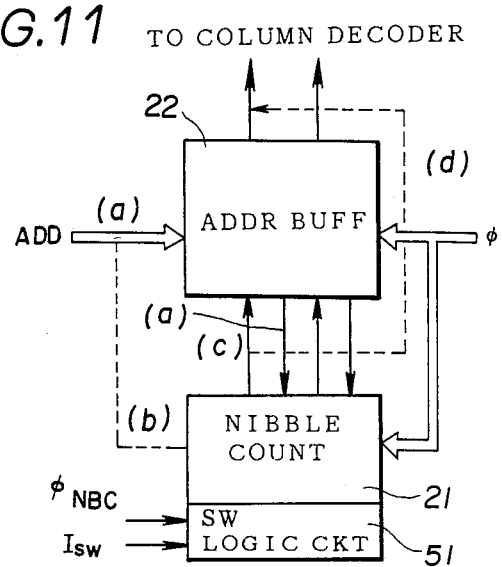
FIG. 11 is a system block diagram showing an essential part of a second embodiment of the memory device according to the present invention for explaining the operating principle thereof.

Next, a description will be given on a second embodiment of the memory device according to the present invention. FIG. 11 shows an essential part of the second embodiment for explaining the operating principle thereof. In FIG. 11, those parts which are the same as those corresponding parts in FIG. 4 are designated by the same reference numerals, and a description thereof will be omitted. In the present embodiment, the memory device additionally comprises a switching logic circuit 51, and switching information $I_{SW}$ is supplied to the switching logic circuit 51. The switching information $I_{SW}$ relates to bonding option (or information), information concerning the melting of a fuse, information related to aluminum wiring and the like. The timings of the $\overline{RAS}$, $\overline{CAS}$ and the address are the same as those shown in FIGS. 5(A) through 5(C).

In the nibble mode, the bits of data related to the entered column and row addresses are successively outputted responsive to the toggle of the $\overline{CAS}$, as described before. For example, in the case of a 1 M×1 bit memory device, the nibble address is determined by a row address bit RA9 and a column address bit CA9. But in the case of a 256 K×4 bit memory device, the nibble address is determined by column address bits CA0 and CA1. Accordingly, in the present embodiment, the switching logic circuit 51 switches the bits of the nibble counter 21 responsive to the switching information $I_{SW}$ so that the nibble address can be generated rom the same nibble counter 21 regardless of the memory structure of the memory device.

Figure 12:
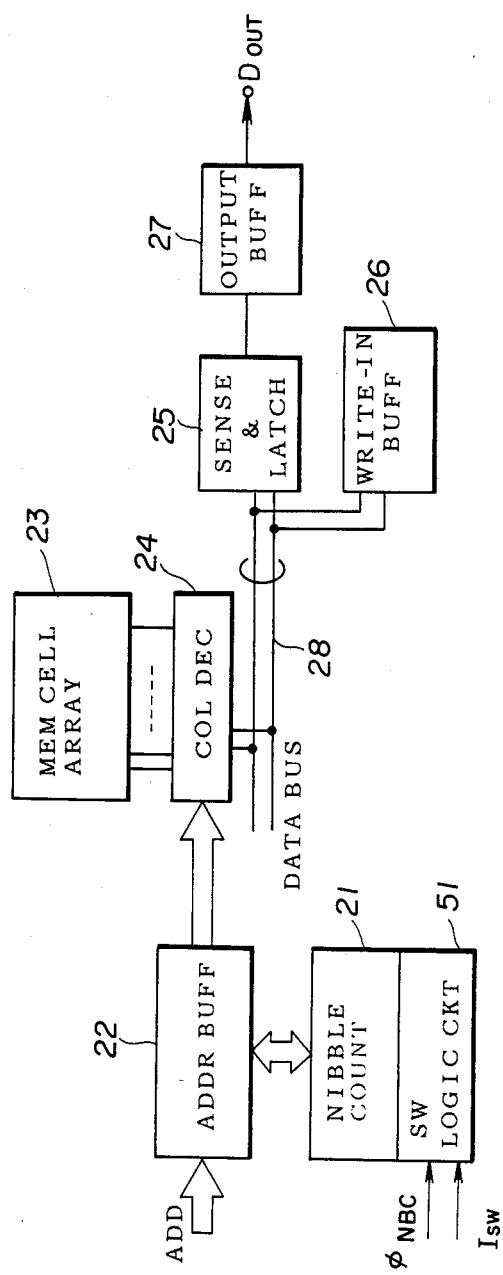
FIG. 12 is a system block diagram showing a more detailed construction of the second embodiment.

FIG. 12 shows a more detailed construction of the second embodiment. In FIG. 12, those parts which are the same as those corresponding parts in FIGS. 6 and 11 are designated by the same reference numerals, and a description thereof will be omitted.

Figure 13:
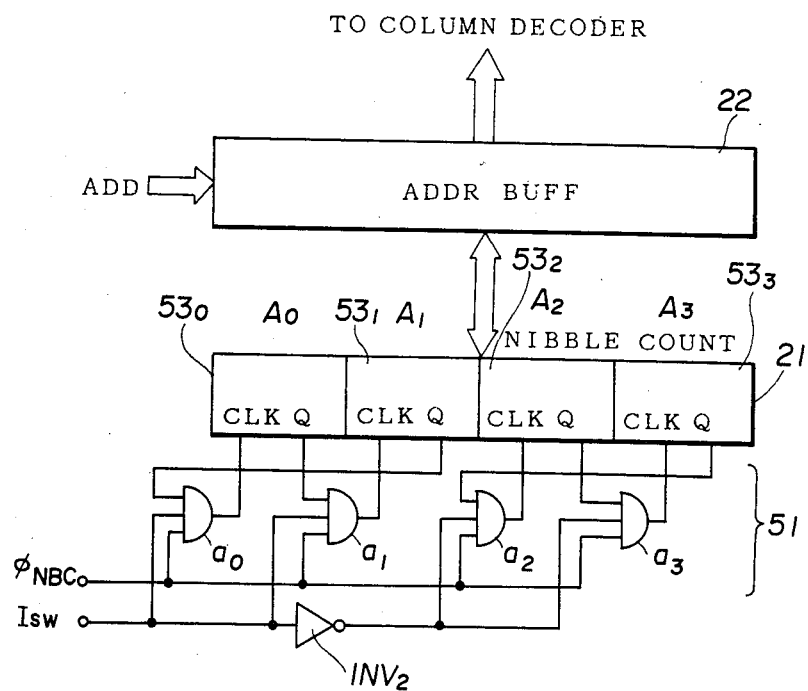
FIG. 13 is a system circuit diagram showing a more detailed construction of the block system shown in FIG. 11.
Figure 15:
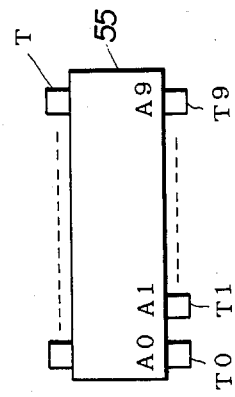
FIG. 15 a plan view showing an integrated circuit package shown in FIG. 14.

Next, a description will be given on the operation of switching the nibble address, by referring to FIGS. 13 through 15. FIG. 13 shows a more detailed construction of the block system shown in FIG. 11. FIG. 13 shows the case where the bits determining the nibble address are switched between bits A0 and A1 and bits A2 and A3. In FIG. 13, it will be assumed for convenience' sake that only the specific bits A0 and A1 and the specific bits A2 and A3 of the external address ADD are initially set in the nibble counter 21. The other bits of the external address ADD may be stored separately in a register (not shown), for example. However, it is also possible to take measures that all of the bits of the external address ADD are entered into the nibble counter 21 but the address values of the bits other than the bits determining the nibble address remain unchanged.

As described before, the external address ADD is stored in the nibble counter 21 through the address buffer 22. A clock signal for causing the nibble counter 21 to count up is determined by the switching logic circuit 51. The switching logic circuit 51 comprises AND circuits $a_0$ through $a_3$ and an inverter $INV_2$. The AND circuit $a_0$ obtains a logical product of an output $Q_1$ of a counter element $53_1$ corresponding to the address bit A1, the nibble clock signal $\phi_{NBC}$ and the switching information $I_{SW}$. The AND circuit $a_1$ obtains a logical product of an output $Q_0$ of a counter element $53_0$ corresponding to the address bit A0, the nibble clock signal $\phi_{NBC}$ and the switching information $I_{SW}$. The AND circuit $a_2$ obtains a logical product of an output $Q_3$ of a counter element $53_3$ corresponding to the address bit A3, the nibble clock signal $\phi_{NBC}$ and an inverted switching information $\overline{I}_{SW}$. In addition, the AND circuit $a_3$ obtains a logical product of an output $Q_2$ of a counter element $53_2$ corresponding to the address bit A2, the nibble clock signal $\phi_{NBC}$ and the inverted switching information $\overline{I}_{SW}$. Outputs of the AND circuits $a_0$ through $a_3$ are supplied to clock terminals CLK of the corresponding counter elements $53_0$ through $53_3$ of the nibble counter 21. As a result, the nibble clock signal $\phi_{NBC}$ is selectively supplied to the clock terminals CLK of the bits A0 and A1 or the bits A2 and A3 of the nibble counter 21 depending on the switching information $I_{SW}$. For example, when the switching information $I_{SW}$ is a high-level signal, the nibble clock signal $\phi_{NBC}$ is selectively supplied to the clock terminals CLK of the counter elements $53_0$ and $53_1$ corresponding to the bits A0 and A1 of the nibble counter 21, and the bits A0 and A1 change as shown in the following Table 1 while the bits A2 and A3 remain unchanged responsive to each nibble clock signal $\phi_{NBC}$, where (1) through (5) in the Table 1 denote the five sequential pulses of the nibble clock signal $\phi_{NBC}$.

TABLE 1

|     | A0 | A1 | A2 | A3 |
|-----|----|----|----|----|
| (1) | 0  | 0  | 0  | 0  |
| (2) | 1  | 0  | 0  | 0  |
| (3) | 0  | 1  | 0  | 0  |
| (4) | 1  | 1  | 0  | 0  |
| (5) | 0  | 0  | 0  | 0  |

On the other hand, when the switching information $I_{SW}$ is a low-level signal, the nibble clock signal $\phi_{NBC}$ is selectively supplied to the clock terminals CLK of the counter elements $53_2$ and $53_3$ corresponding to the bits A2 and A3 of the nibble counter 21, and the bits A2 and A3 change while the bits A0 and A1 remain unchanged responsive to each nibble clock signal $\phi_{NBC}$.

Figure 14:
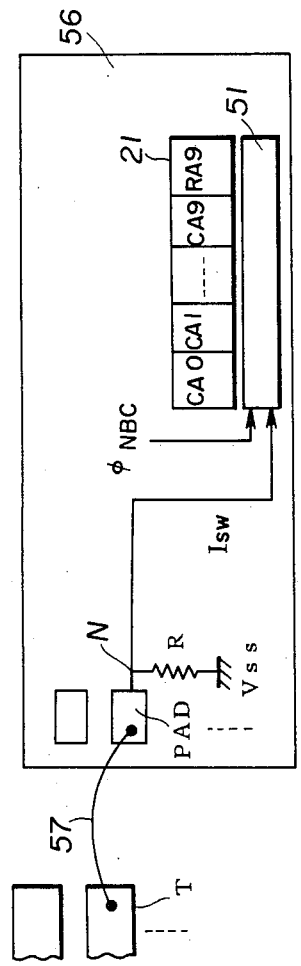
FIG. 14 is a diagram for explaining the switching of the nibble address by bonding option.

FIG. 14 is a diagram for explaining the switching of the nibble address for the case where the present embodiment is applied to a 1 Mbit memory device. The memory structure is selected by bonding option. FIG. 15 is a plan view showing an integrated circuit package. In FIG. 14, a pin T of an integrated circuit (IC) package 55 is bonded to a bonding pad on an IC chip 56 by an aluminum wire 57. The logic value of the switching information $I_{SW}$, that is, the bonding option in this case, is determined by whether or not the bonding is made. For example, the switching information $I_{SW}$ has a low level (logic value "0") when no bonding is made and has a high level (logic value "1") when the bonding is made by the aluminum wire 57.

When it is assumed that the potential at the pin T of the IC package 55 is equal to the power source voltage Vcc which is a high level, the potential at a node N is high when the terminal T and the bonding pad PAD are bonded by the aluminum wire 57, and the switching information $I_{SW}$ has the high level. On the other hand, the potential at the node N is low when no bonding is made because a resistor R is connected between the node N and a ground voltage Vss which is a low level, and the switching information $I_{SW}$ has the low level.

According to the address multiplexing, a row address bit RA and a column address bit CA are entered through a common terminal of the IC package 55. For example, the row address bit RA0 and the column address bit CA0 are entered time-divisionally through a pin T0. This means that the row address bit RA9 and the column address bit CA9 are entered on after the other in time division through a terminal T9. Hence, the column address bits CA0 through CA9 and the row address bit RA9 are entered into the nibble counter 21 through the pins T0 through T9.

In the case of the 1 M×1 bit memory device, no bonding is made. In this case, the least significant bits RA9 and CA9 determine the nibble address. The nibble counter 21 counts up responsive to each nibble clock signal $\phi_{NBC}$, but only the bits RA9 and CA9 change and the remaining bits including the most significant bits CA0 and CA1 remain unchanged as shown in Table 2. In the case of the 1 M×1 bit memory device, the memory is designed so that the row address bit RA9 is used for the nibble address. For this reason, the number of bits (memory cells) selected by the row address (row address bits RA0 through RA8) is $2^9=512$, while the number of bits selected by the column address (bits CA0 through CA9 and bit RA9) is $2^{11}=2048$.

TABLE 2

| Address Bit | CA0 | CA1 | --- | CA9 | RA9 |
|---|---|---|---|---|---|
| Logic Value | 0 | 0 | 0—0 | 1 | 1 |
| | 0 | 0 | 0—0 | 1 | 0 |
| | 0 | 0 | 0—0 | 0 | 1 |
| | 0 | 0 | 0—0 | 0 | 0 |

On the other hand, in the case of the 256 K×4 bit memory device, the pin T is bonded to the bonding pad PAD by the aluminum wire 57. In this case, the most significant bits CA0 and CA1 determine the nibble address. The nibble counter 21 counts up responsive to each nibble clock signal $\phi_{NBC}$, but only the bits CA0 and CA1 change and the remaining bits including the least significant bits CA9 and RA9 remain unchanged as shown in Table 3.

TABLE 3

| Address Bit | CA0 | CA1 | --- | CA9 | RA9 |
|---|---|---|---|---|---|
| Logic Value | 0 | 0 | 0—0 | 0 | 0 |
| | 1 | 0 | 0—0 | 0 | 0 |
| | 0 | 1 | 0—0 | 0 | 0 |
| | 1 | 1 | 0—0 | 0 | 0 |

Figure 16:
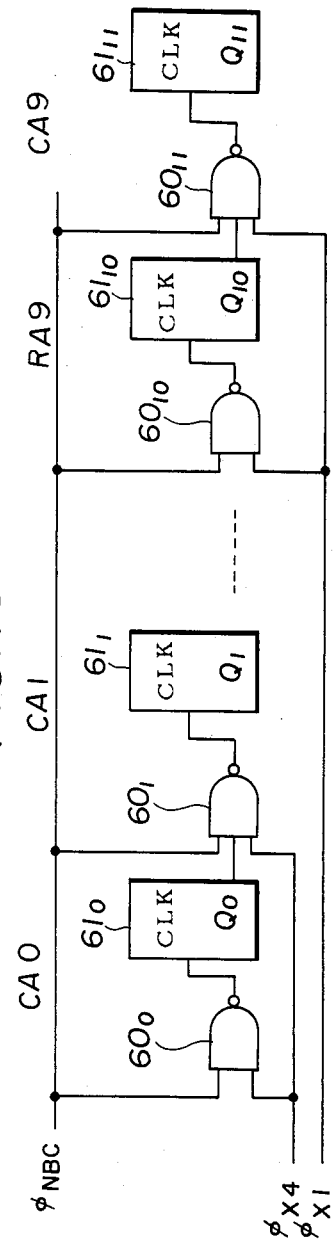
FIG. 16 is a system circuit diagram showing another embodiment of the switching logic circuit together with a part of the nibble counter.

FIG. 16 shows another embodiment of the switching logic circuit together with a part of the nibble counter. In the present embodiment, the nibble address for the 256 K×4 bit memory device and the 1 M×1 bit memory device decided by the Joint Electron Device Engineering Council (JEDEC) are generated by the same nibble counter. The switching logic circuit 51 comprises NAND circuits $60_0$ through $60_{11}$, and a part of the nibble counter 21 shown comprises counters $61_1$ through $61_{11}$. Clock signals $\phi_{X1}$ and $\phi_{X4}$ are generated from the switching information such as the bonding information. In the case of the 256 K×4 bit memory device, the nibble counter 21 outputs the address bits CA0 and CA1 during a high-level period of the clock signal $\phi_{X4}$. On the other hand, in the case of the 1 M×1 bit memory device, the nibble counter 21 outputs the address bits RA9 during a high-level period of the clock signal $\phi_{X1}$ when the level of clock signal $\phi_4$ is low.

According to the present embodiment, it is possible to arbitrarily select the memory structure of the 1 Mbit memory device between 1 M×1 bit and 256 K×4 bits by providing or not providing the bonding between the terminal and the bonding pad of the IC package, and the nibble address for the different memory structures can be generated by the same nibble counter.

In the present embodiment, the switching information ($I_{SW}$, $\phi_{X1}$ and $\phi_{X4}$) which is used to switch the bits of the nibble counter determining the nibble address is not limited to the information related to the bonding, and may be other information such as information indicating whether or not a fuse is melted and information related to an aluminum wiring indicating whether or not an aluminum wiring is provided between specific terminals and the like.

Further, the present invention is not limited to those embodiments, but various variations and modifications may be made without departing from the scope of the present invention.

What is claimed is:

1. A memory device employing address multiplexing wherein a row address and a column address are respectively received from an exterior responsive to a row address strobe and a column address strobe, said memory device comprising:
   a memory cell array having a matrix arrangement of memory cells, each memory cell being designated by the row address and the column address;
   a column decoder supplied with an address signal for designating the column address of said memory cell array;
   a data bus for transferring data to and from said memory cell array; and
   a counter for initially receiving an external address and for successively incrementing a counted address value therein responsive to toggle of said column address strobe during one active time period of said row address strobe, said counter successively supplying the counted address value to said column decoder as the address signal.

2. A memory device as claimed in claim 1 which further comprises an address buffer supplied with said external address, said counter being supplied with said external address directly.

3. A memory device as claimed in claim 1 which further comprises an address buffer supplied with said external address, said counter being supplied with said external address through said address buffer.

4. A memory device as claimed in claim 1 which further comprises an address buffer supplied with said external address, said counter supplying the counted address value to said column decoder directly.

5. A memory device as claimed in claim 1 which further comprises an address buffer supplied with said external address, said counter supplying the counted address value to said column decoder through said address buffer.

6. A memory device as claimed in claim 1 in which said counter comprises at least two bits, said counter being supplied with at least two predetermined bits of said external address.

7. A memory device as claimed in claim 6 in which said counter successively increments the counted address value by incrementing only said two predetermined bits of said external address.

8. A memory device as claimed in claim 1 in which said counter comprises at least four bits, said counter being supplied with at least four predetermined bits of said external address.

9. A memory device as claimed in claim 6 in which said counter successively increments the counted address value by incrementing only two predetermined bits out of said four predetermined bits of said external address.

10. A memory device as claimed in claim 1 which further comprises a write-in buffer and a sense and latch circuit, said write-in buffer being supplied with a write-in data in a write mode, said data bus transferring the write-in data from said write-in buffer to said column decoder and transferring a read-out data from said memory cell array, said sense and latch circuit sensing and latching the read-out data received through said data bus in a read mode.

11. A memory device employing address multiplexing wherein a row address and a column address are respectively received from an exterior responsive to a row address strobe and a column address strobe, said memory device comprising:

a memory cell array having a matrix arrangement of memory cells, each memory cell being designated by the row address and the column address;

a column decoder supplied with an address signal for designating the column address of said memory cell array;

a data bus for transferring data to and from said memory cell array;

a counter for initially receiving an external address and for successively incrementing a counted address value therein responsive to toggle of said column address strobe during one active time period of said row address strobe so as to successively supply the counted address value to said column decoder as the address signal, said counter comprising at least four bits and being supplied with at least predetermined four bits of said external address, said counter successively incrementing the counted address value by incrementing only two predetermined bits out of said four predetermined bits of said external address; and a switching logic circuit supplied with external switching information and coupled to said counter for determining said two predetermined bits in said counter depending on said external switching information.

12. A memory device as claimed in claim 11 in which said external switching information relates to information selected from a group of information dependent on a memory structure of said memory device and including bonding information, information concerning the melting of a fuse and information related to an existence of a specific wiring in said memory device.

13. A memory device as claimed in claim 11 which further comprises an address buffer supplied with said external address, said counter being supplied with said external address directly.

14. A memory device as claimed in claim 11 which further comprises an address buffer supplied with said external address, said counter being supplied with said external address through said address buffer.

15. A memory device as claimed in claim 11 which further comprises an address buffer supplied with said external address, said counter supplying the counted address value to said column decoder directly.

16. A memory device as claimed in claim 11 which further comprises an address buffer supplied with said external address, said counter supplying the counted address value to said column decoder through said address buffer.

17. A memory device as claimed in claim 11 which further comprises a write-in buffer and a sense and latch circuit, said write-in buffer being supplied with a write-in data in a write mode, said data bus transferring the write-in data from said write-in buffer to said column decoder and transferring a read-out data from said memory cell array, said sense and latch circuit sensing and latching the read-out data received through said data bus in a read mode.

* * * * *